(12) United States Patent
Endo

(10) Patent No.: US 7,981,840 B2
(45) Date of Patent: Jul. 19, 2011

(54) METHOD OF MANUFACTURING BI-BASED OXIDE SUPERCONDUCTOR THIN FILMS

(75) Inventor: Kazuhiro Endo, Ryugasaki (JP)

(73) Assignee: National Institute of Advanced Industrial Science and Technology (JP)

( * ) Notice: Subject to any disclaimer, the term of this patent is extended or adjusted under 35 U.S.C. 154(b) by 1079 days.

(21) Appl. No.: 11/363,653

(22) Filed: Feb. 28, 2006

(65) Prior Publication Data
US 2006/0205602 A1 Sep. 14, 2006

(30) Foreign Application Priority Data

Mar. 2, 2005 (JP) .................. 2005-058246
Mar. 30, 2005 (JP) .................. 2005-099504

(51) Int. Cl.
*C04B 35/45* (2006.01)
*B05D 5/12* (2006.01)
*H01L 39/12* (2006.01)
*H01L 39/14* (2006.01)

(52) U.S. Cl. .......... 505/470; 427/62; 505/121; 505/125; 505/729; 505/782

(58) Field of Classification Search ............. 505/329, 505/474
See application file for complete search history.

(56) References Cited

U.S. PATENT DOCUMENTS

| | | |
|---|---|---|
| 4,996,185 A | 2/1991 | Fujimori et al. |
| 5,055,445 A | 10/1991 | Belt et al. |
| 5,110,790 A | 5/1992 | Feenstra et al. |
| 5,206,214 A | 4/1993 | Fujimori et al. |
| 5,244,873 A | 9/1993 | Hattori et al. |
| 5,413,986 A | 5/1995 | Nakamura |
| 5,602,080 A | 2/1997 | Bednorz et al. |

(Continued)

FOREIGN PATENT DOCUMENTS

JP 05-007027 1/1993

(Continued)

OTHER PUBLICATIONS

"Evidence for step flow growth of Bi-Sr-Ca-Cu-O thin films on vicinal substrates by metalorganic chemical vapor deposition" by Sugimoto et al, Appl. Phys. Lett. 63 (19) Nov. 8, 1993 pp. 2697-2699.*

(Continued)

*Primary Examiner* — Jerry Lorengo
*Assistant Examiner* — Jared Wood
(74) *Attorney, Agent, or Firm* — Ostrolenk Faber LLP

(57) ABSTRACT

A well-crystallized a-axis (or b-axis) oriented Bi-based oxide superconductor thin film is manufactured in order to obtain a high performance layered Josephson junction using a Bi-based oxide superconductor. In manufacturing a well-crystallized a-axis oriented Bi-based oxide superconductor thin film, a (110) plane of a single crystal substrate of $LaSrAlO_4$ or a vicinal cut substrate of a single crystal of $LaSrAlO_4$ is used, on which an a-axis oriented Bi-2223 or Bi-2201 thin film is heteroepitaxially grown at a low film forming temperature $T_1$, then homoepitaxially grown on the grown film at a high film forming temperature $T_2$ (double temperature growth method). Although it is difficult to grow an a-axis oriented film directly on a substrate at a high temperature $T_2$, an a-axis oriented Bi-2223 or Bi-2201 thin film is formed on the base by previously forming the base film at low deposition temperature.

8 Claims, 8 Drawing Sheets

U.S. PATENT DOCUMENTS

| | | | |
|---|---|---|---|
| 5,691,279 A | | 11/1997 | Tauber et al. |
| 5,750,474 A | * | 5/1998 | Sung et al. .................... 505/329 |
| 6,074,768 A | | 6/2000 | Matsunaga et al. |
| 6,183,552 B1 | * | 2/2001 | Sakai et al. ....................... 117/3 |
| 6,531,235 B2 | * | 3/2003 | Lee et al. ...................... 428/702 |

FOREIGN PATENT DOCUMENTS

| | | |
|---|---|---|
| JP | 09-246611 | 9/1997 |

OTHER PUBLICATIONS

Kula, et al., "Highly Oriented Bi-Based Thin Films With Zero Resistance At 106K," IEEE Transactions On Magnetics, vol. 27, No. 2, (Mar. 1991), pp. 1581-1584.

V. Kleptsyn, et al., "High Temperature Superconducting Thin Films On $CaGdAlO_4$ Substrates," Journal of Crystal Growth 196, (1999), pp. 122-125.

* cited by examiner (a) Single Temperature Growth (b) Double Temperature Growth (a) Single Temperature Growth Substrate Direction (b) Double Temperature Growth Film Direction Resistivity along [001] Direction (a) Single Temperature Growth Resistivity along [010] Direction (a) Single Temperature Growth (b) Double Temperature Growth (b) Double Temperature Growth (a) Flat Substrate (b) Vicinal Substrate Resistivity along [001] Direction (a) Flat Substrate Resistivity along [010] Direction (a) Flat Substrate (b) Vicinal Substrate (b) Vicinal Substrate

METHOD OF MANUFACTURING BI-BASED OXIDE SUPERCONDUCTOR THIN FILMS

FIELD OF THE INVENTION

The present invention relates to an oxide superconductor with a c-axis oriented parallel to a substrate and an a-axis (or b-axis) oriented perpendicular to the substrate, especially to bismuth based (hereunder "Bi-based") oxide superconductor thin films, specifically $Bi_2Sr_2Ca_2Cu_3O_{10\pm X}$ (where X is a positive number less than unity, hereunder "Bi-2223") or $Bi_2Sr_2CuO_{6\pm Y}$ (where Y is a positive number less than unity, hereunder "Bi-2201"), in order to obtain a high performance layered Josephson junction using an oxide superconductor especially a Bi-based oxide superconductor, and a method of manufacturing the same.

Priority is claimed to Japanese application No. 2005-058246, filed Mar. 2, 2005, and Japanese application No. 2005-099504, filed Mar. 30, 2005, which are incorporated herein by reference.

DESCRIPTION OF RELATED ART

A feature of a Josephson device, which uses a superconductor, is its high speed operation and low power consumption. When applied to an integrated circuit, it can perform high speed switching with little electric power. In addition to the high speed switching, the Josephson device shows a smaller heat production than a high density integrated circuit, in which heat production is a problem common to semiconductor devices. Therefore, it is expected that the Josephson device exhibits a higher speed operation performance compared to a semiconductor.

Conventionally, Nb metal or NbN was used as a superconductor in a Josephson device. However, because the superconductive transition temperature is low, the Josephson device was usually operated at a liquid helium temperature of 4.2K. Compared to this, since an oxide superconductor has a higher superconductive transition temperature, a Josephson device using an oxide superconductor can be operated at around a liquid nitrogen temperature, and thus it is favorable from the view of resource and energy saving.

A superconductive device that shows the Josephson effect is called a Josephson junction. A Josephson junction, which is suitable for constituting an integrated circuit using superconductive devices, is favorable to be manufactured as a layered junction that has a very thin barrier layer of a normal conductor or an insulator inserted between two superconductive thin films as shown in FIG. 1, as it enables precise dimensional control and the manufacture of many junctions. In practice, a laminated junction is also being used as a Josephson junction in superconductive integrated circuits using Nb metal.

A problem that requires a breakthrough in order to realize manufacturing of a layered Josephson junction using an oxide superconductor, is closely related to the crystal structure of oxide superconductors. Yttrium based (hereunder "Y-based") oxide superconductors and Bi-based oxide superconductors have more remarkable anisotropy of superconducting properties such as coherence length, magnetic flux penetration depth, or critical current density, than for conventional superconductors such as Nb.

The crystals of these superconductors have orthorhombic lattice or tetragonal lattice structure, but the strength of the superconductive coupling in the c-axis direction is weaker than the coupling in the in-plane direction of a surface that is perpendicular to the c-axis. Superconductivity of an oxide superconductor is thought to occur in a CuO plane composed of a copper (Cu) atom and an oxygen (O) atom.

Therefore, the anisotropy of the superconductive coupling derives from the fact that the CuO plane is oriented perpendicular to a c-axis (namely, in the a- or b-axis direction), and not in the c-axis direction. Accordingly, the coherence length (the inter-electronic distance in which a superconducting electron pair is formed) which is closely related in a Josephson junction, is significantly shorter in the c-axis direction than in the a-axis direction. This tendency is more remarkable in a Bi-based superconductor, whose crystal structure has bigger anisotropy than that of a Y-based superconductor, and the coherence length in the c-axis direction is as short as 0.2 nm.

Thus, an oxide superconductor, especially a Bi-based superconductor such as Bi-2223 or Bi-2201 has extremely short coherence length in the c-axis direction. Therefore, in order to manufacture a Josephson junction layered in the c-axis direction using c-axis oriented films it is essential to form an even and very thin barrier layer. However, in making a barrier layer very thin, a rough surface caused by deposit and so on becomes a problem, which makes it difficult to form a very thin uniform barrier layer, and which causes current leakage between superconductors sandwiching the barrier layer from each side. Therefore this type of Josephson junction has not been obtained yet. Moreover, even if the Josephson junction can be formed, the Josephson critical current density Jc and the Josephson characteristic parameter IcRn are small, and good characteristics may not be obtained.

Accordingly, in order to obtain a high performance layered Josephson junction using a Bi-based oxide superconductor, it is essential to manufacture a junction in the non c-axis direction in which the coherence length is longer than in the c-axis direction. Among these directions, the direction in which the coherence length is the longest is the a-axis (or b-axis) direction. Therefore, in order to obtain a high performance layered Josephson junction using a Bi-based oxide superconductor, it is preferable to manufacture a Bi-based oxide superconductor thin film whose c-axis is oriented parallel to the substrate and whose a-axis (or b-axis) is oriented perpendicular to the substrate.

As one of the methods to realize this, there is known (Japanese Unexamined Patent Application, First Publication No. Hei 5-7027) a method of manufacturing an oxide superconductor film comprising; a step for forming a composition modulated film composed of oxides on a substrate by supplying active oxygen and a part of the metallic components of a Bi-based oxide onto the substrate, and a step for forming an oxide superconductor thin film on the composition modulated film by supplying active oxygen and all of the metallic components of the Bi-based oxide. However, according to this method, the proportion of the c-axis that is parallel to the substrate varies depending on conditions, and it can not be said that a Bi-based oxide superconductor thin film of good quality can be obtained.

Another method is proposed (Japanese Unexamined Patent Application, First Publication No. Hei 9-246611), where a Josephson device using a Bi-based oxide superconductor thin film whose c-axis is oriented parallel to the substrate and whose a-axis (or b-axis) is oriented perpendicular to the substrate, has excellent performance. However, there is no disclosure of any specific process to obtain the good quality Bi-based oxide superconductor thin film whose c-axis is oriented parallel to the substrate and whose a-axis (or b-axis) is oriented perpendicular to the substrate.

SUMMARY OF THE INVENTION

Consequently, it is an object of the present invention to manufacture a well-crystallized a-axis (or b-axis) oriented Bi-based oxide superconductor thin film, in order to obtain a high performance layered Josephson junction using a Bi-based oxide superconductor.

The present invention discloses two embodiments as described below.

In the first embodiment, an a-axis oriented Bi-2223 thin film is grown by a process where one unit cell of Bi-2223 is in conformity with three units of any one of a single crystal substrate of $LaSrAlO_4$ having a (110) plane, a single crystal substrate of $LaSrGaO_4$ having a (110) plane, a single crystal substrate of $\alpha$-$Al_2O_3$ having a (10-10) plane (a-plane), or a single crystal substrate of $NdAlO_3$ having a (10-10) plane (a-plane).

In a Bi-2201 thin film, an a-axis oriented Bi-2201 thin film is grown by a process where one unit cell of Bi-2201 is in conformity with two units of any one of a single crystal substrate of either $LaSrAlO_4$ having a (110) plane, a single crystal substrate of $LaSrGaO_4$ having a (110) plane, a single crystal substrate of $\alpha$-$Al_2O_3$ having a (10-10) plane (a-plane), or a single crystal substrate of $NdAlO_3$ having a (10-10) plane (a-plane).

In a first method of manufacturing a well-crystallized a-axis oriented Bi-based oxide superconductor thin film, a (110) crystal plane of a single crystal substrate of $LaSrAlO_4$ or the like is used, on which an a-axis oriented Bi-2223 or Bi-2201 thin film is heteroepitaxially grown at a low film forming temperature $T_1$ (500 to 600° C.), then homoepitaxially grown on the grown film at a high film forming temperature $T_2$ (650° C. to 750° C.) (double temperature growth method). Normally, if a film is directly formed on a substrate at a high temperature $T_2$, a c-axis oriented Bi-2223 or Bi-2201 thin film is grown. However, by previously growing the a-axis oriented Bi-2223 or Bi-2201 thin film on the base, even if a film is formed at an increased substrate temperature, no c-axis oriented film is formed and a well-crystallized a-axis oriented Bi-2223 or Bi-2201 thin film can be manufactured.

When manufacturing a Josephson device using a well-crystallized a-axis oriented Bi-based oxide superconductor thin film made by the method according to the first embodiment of the present application, it is possible to obtain a Josephson device of extremely high performance.

In the second embodiment, by using a vicinal substrate cut with a finite angle $\theta$ from a (110) plane of a single crystal of $LaSrAlO_4$ or $LaSrGaO_4$ or the like, in the direction of [001], or a vicinal substrate cut with a finite angle $\theta$ from a (10-10) plane (a-plane) of a single crystal of $\alpha$-$Al_2O_3$ or $NdAlO_3$ or the like, in the direction of [001], and employing a double temperature growth method, a thin film is formed on the substrate by a step flow growth process in which the starting point is a step of the substrate as shown in FIG. 4, and a high quality a-axis oriented Bi-2223 thin film having a good superconducting property can be obtained.

When manufacturing a Josephson device using a high quality a-axis oriented Bi-based oxide superconductor thin film made by the method according to the second embodiment of the present application, it is possible to obtain a Josephson device of extremely high performance.

DETAILED DESCRIPTION OF THE INVENTION

The first embodiment and the second embodiment of the present invention will be described in detail hereinafter.

First Embodiment

The first embodiment according to the present invention will be described with reference to the attached drawings.

Figure 1:
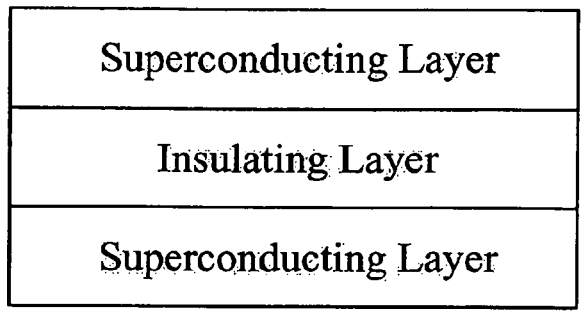
FIG. 1 is a promising example of a Josephson junction.
Figure 2:
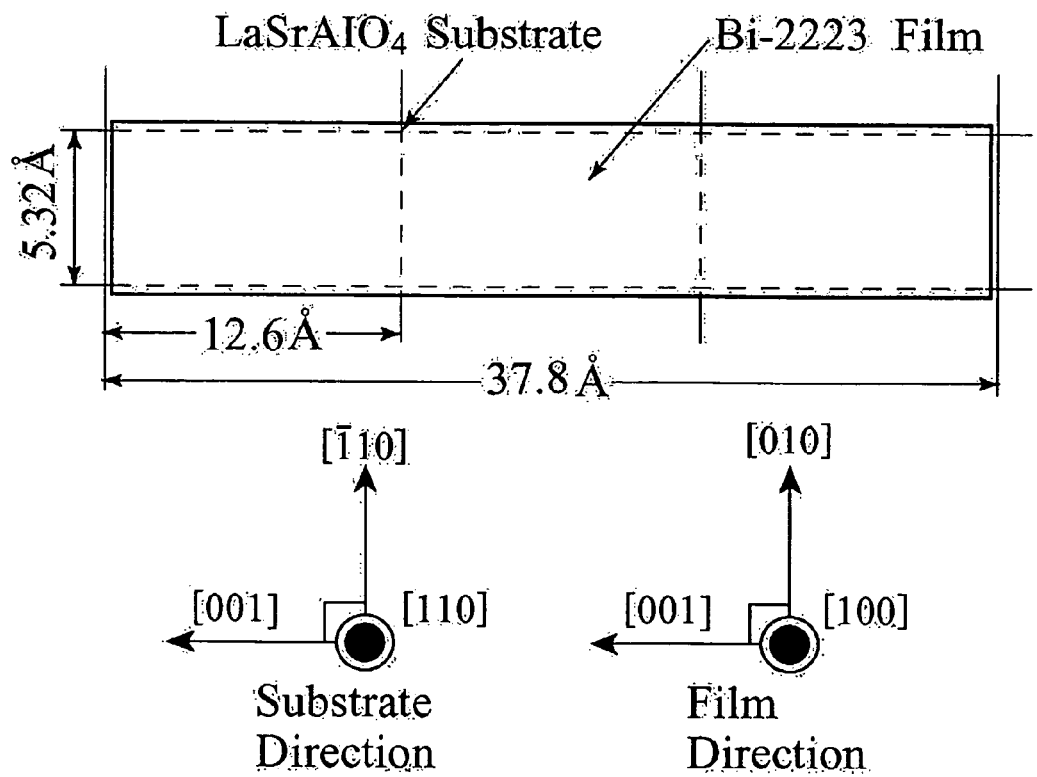
FIG. 2 is an explanatory drawing of a lattice conformity state.

FIG. 2 shows conformity of lattice constants of a (110) plane of a single crystal substrate of $LaSrAlO_4$ and lattice constants of a-axis oriented Bi-2223 formed thereon. As shown in FIG. 2, it is understood that one unit cell of Bi-2223 is in conformity with three unit cells of $LaSrAlO_4$ extremely well. It is also understood that the misfit of the lattice constants for the a-axis length (or b-axis length) and the c-axis length are −1.48% and 1.61%, respectively, which is extremely small.

Therefore, on a (110) $LaSrAlO_4$ single crystal substrate, a Bi-2223 thin film whose c-axis is oriented parallel to the substrate and whose a-axis (or b-axis) is oriented perpendicular to the substrate, can be heteroepitaxially grown. However, at this time, there is a problem in that a well-crystallized thin film cannot be obtained at a low film forming temperature $T_1$ (single temperature growth method). On the other hand, if a film is formed at a high film forming temperature $T_2$ from the beginning, a c-axis oriented Bi-2223 thin film is grown regardless of the conformity with the substrate.

Therefore, on a (110) single crystal substrate of $LaSrAlO_4$, firstly an a-axis oriented Bi-2223 thin film is heteroepitaxially grown at a low film forming temperature $T_1$, then homoepitaxially grown on the grown film at a high film forming temperature $T_2$ (double temperature growth method). As a result, even if the film forming temperature is increased, a well-crystallized a-axis oriented Bi-2223 thin film mixed with no c-axis oriented film can be manufactured by a MOCVD thin film forming device shown schematically in FIG. 5.

Example 1

Figure 3:
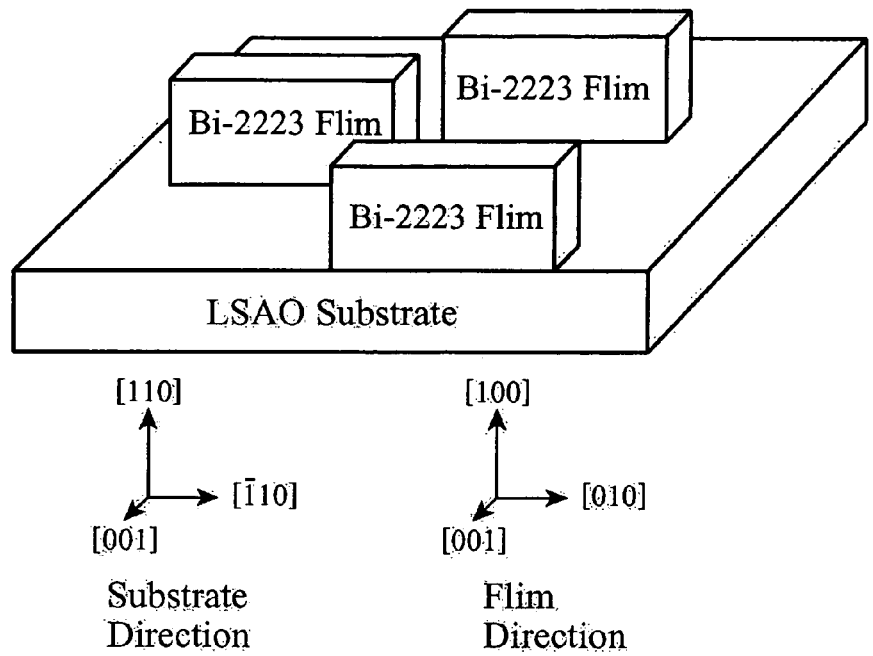
FIG. 3 shows a model of two dimensional nucleus growth.

Using a (110) single crystal substrate of $LaSrAlO_4$, a well-crystallized a-axis oriented Bi-2223 superconductor thin film was manufactured by metal-organic chemical vapor deposition (MOCVD). The MOCVD device is shown in FIG. 3. The film was formed under the following film forming conditions: $Bi(C_6H_5)_3$, $Sr(DPM)_2$, $Ca(DPM)_2$, and $Cu(DPM)_2$ (DPM: dipivaloylmethan) were used as metal-organic materials while each temperature was maintained at 72° C., 176° C., 161° C., and 80° C., respectively; the Ar carrier gas flow rate was 100, 300, 300, 70 sccm, respectively; the total pressure was 50 torr; the oxygen partial pressure was 23 torr; and the substrate temperature was 555° C. Under these conditions, an a-axis (or b-axis) oriented Bi-2223 thin film was heteroepitaxially grown, and then continually homoepitaxially grown at a temperature as high as the substrate temperature of 677° C. without changing the gas atmosphere.

Figure 6A:
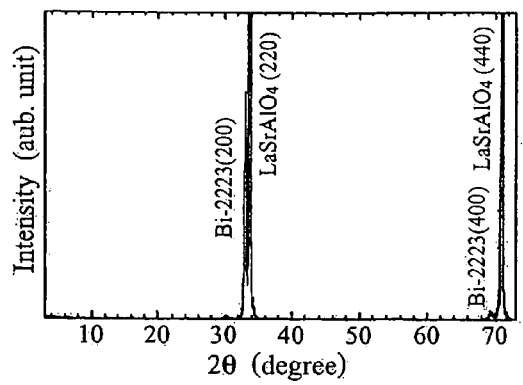
FIGS. 6A and 6B show thin film X-ray diffraction patterns.
Figure 6B:
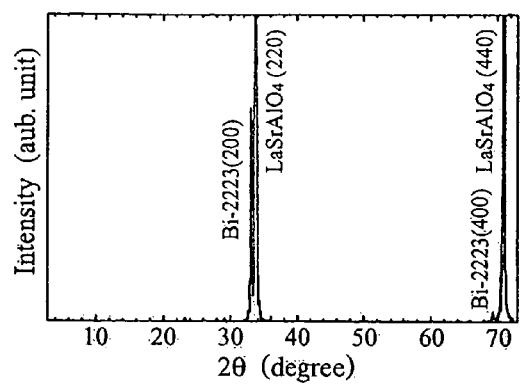

The X-ray diffraction patterns of the a-axis oriented Bi-2223 thin films obtained by the single temperature growth method and the double temperature growth method are shown FIGS. 6A and 6B. In either case, as it is clear from the figure, all of the diffraction peaks except for the substrate can be identified as the (n00) or (0n0) plane of the Bi-2223. According to this, it is confirmed that a Bi-2223 thin film whose c-axis is oriented parallel to the substrate and whose a-axis (or b-axis) is oriented perpendicular to the substrate was manufactured.

In order to compare the crystallizing property of the a-axis oriented Bi-2223 thin films obtained by the single temperature growth method and the double temperature growth method, Table 1 shows half value widths obtained from the X-ray diffraction patterns of FIGS. 6A and 6B. As understood from the table, since the half value width of the double temperature growth method is less than that of the single temperature growth method, it is found that the a-axis oriented Bi-2223 thin film manufactured by the double temperature growth method was better-crystallized than that manufactured by the single temperature growth method.

TABLE 1

Growth method and half value width of X-ray diffraction peak

|  | Half value width of single temperature growth method (degree) | Half value width of double temperature growth method (degree) |
|---|---|---|
| (200) | 0.32 | 0.17 |
| (400) | 0.27 | 0.11 |

Figure 7A:
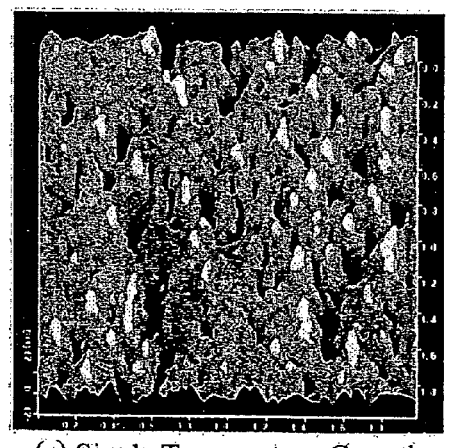
FIGS. 7A and 7B show atomic force microscope (AFM) images of Bi-2223 thin film surfaces.
Figure 7A:
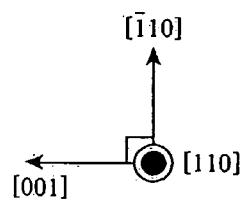
Figure 7B:
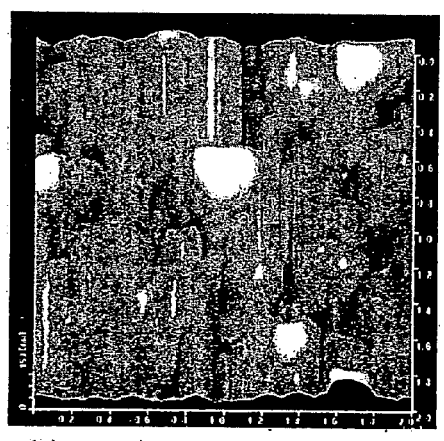
Figure 7B:
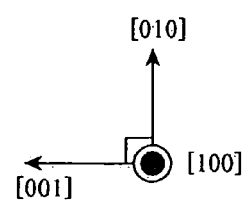

FIGS. 7A and 7B shows atomic force microscope (AFM) images of surfaces of the a-axis oriented Bi-2223 thin films obtained by the single temperature growth method and the double temperature growth method. It is observed that crystal grains in the Bi-2223 thin film of the double temperature growth method are larger compared to those of the single temperature growth method. In this manner, it is found that grain boundaries are reduced and the crystallizing properties are improved by the double temperature growth method.

Figure 8A:
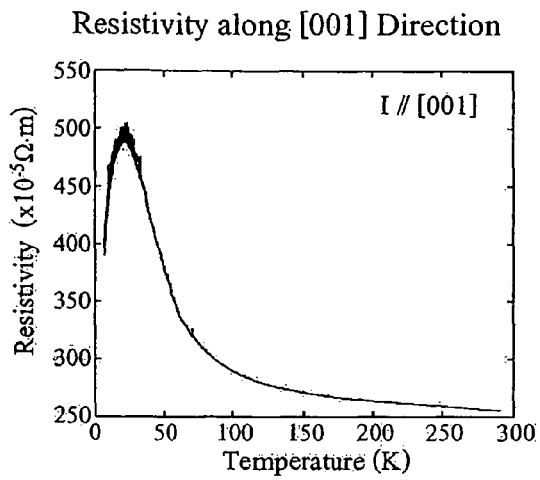
FIGS. 8A to 8B show temperature dependences of resistivity of a-axis oriented Bi-2223 thin films.
Figure 8B:
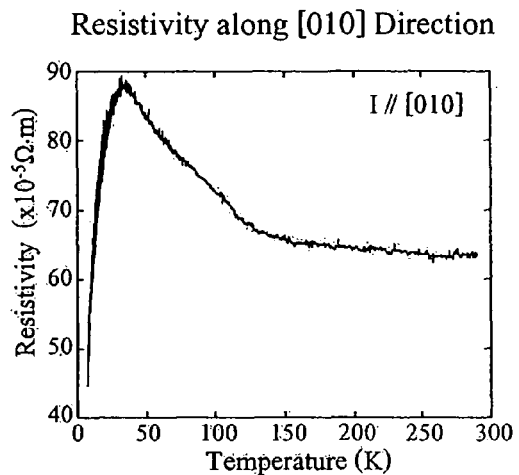
Figure 8C:
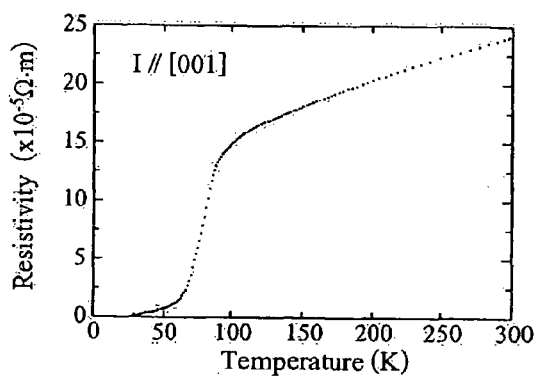
Figure 8D:
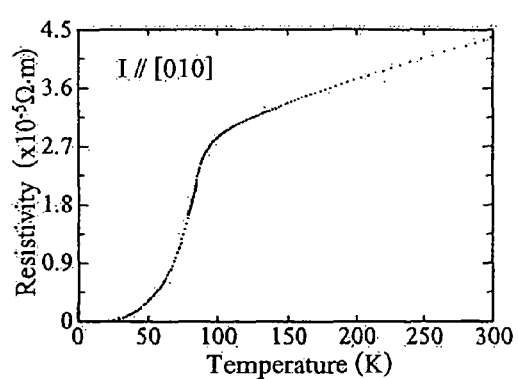

FIGS. 8A and 8B respectively shows temperature dependences of resistivity of the a-axis oriented Bi-2223 thin films obtained by the single temperature growth method and the double temperature growth method. Moreover, Table 2 shows the difference in the superconductive transition temperature (Tc) according to the growth method. Measurement was performed by the standard four terminal method. From the results, by using the double temperature growth method, the resistivity at normal conduction was decreased, the temperature dependence became metal-like, the superconductive transition temperature (Tc) was increased, and the superconducting property was improved. This is considered to be because the crystal grains became larger, the crystallizing property was improved, and the effect of weak coupling between grain boundaries was reduced.

TABLE 2

Growth method and superconductive transition temperature (Tc)

|  | Single temperature growth method | Double temperature growth method |
|---|---|---|
| Growth temperature | $T_1 = 555°$ C. | $T_1 = 555°$ C.<br>$T_2 = 677°$ C. |
| Tc | <4.2 K | 25 K |

As described above, when an a-axis oriented Bi-2223 oxide superconductor thin film is formed, the crystallizing property and the superconducting property of the thin film are improved, in the double temperature growth method where firstly an a-axis oriented Bi-2223 thin film is heteroepitaxially grown on a substrate at a low film forming temperature $T_1$, then homoepitaxially grown thereon at a high film forming temperature $T_2$, rather than with the single temperature growth at a low film forming temperature $T_1$.

Second Embodiment

The second embodiment according to the present invention will be described hereunder.

As described above, FIG. 2 shows conformity of lattice constants of a (110) plane of a single crystal substrate of $LaSrAlO_4$ and lattice constants of a-axis oriented Bi-2223 formed thereon. As shown in FIG. 2, it is understood that one unit cell of Bi-2223 is in conformity with three unit cells of $LaSrAlO_4$ extremely well. It is also understood that the misfit of the lattice constants for the a-axis length (or b-axis length) and the c-axis length are −1.48% and 1.61%, respectively, which is extremely small.

Therefore, on a (110) $LaSrAlO_4$ single crystal substrate, a Bi-2223 thin film whose c-axis is oriented parallel to the substrate and whose a-axis (or b-axis) is oriented perpendicular to the substrate, can be epitaxially grown. However, as shown in FIG. 3, if a flat substrate is used, nuclei are two-dimensionally grown on the substrate and a large number of grains are formed, making it difficult to obtain a continuous and flat film, and worsening the superconducting property due to a weak coupling between grains. Moreover, by a double temperature growth method only, each grain is merely enlarged, it still being difficult to obtain a continuous and even film, and the superconducting properties are poor.

Figure 4:
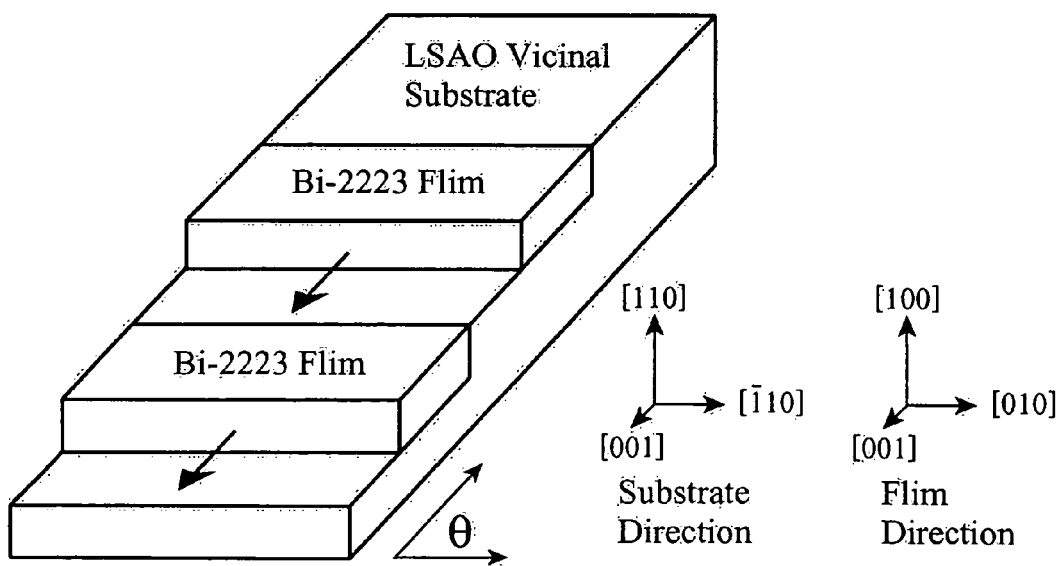
FIG. 4 shows a model of step flow growth.

Accordingly, by using a vicinal substrate cut with a finite angle θ from a (110) plane of a single crystal of $LaSrAlO_4$ or $LaSrGaO_4$ or the like, in the direction of [001], or a vicinal substrate cut with a finite angle θ from a (10-10) plane (a-plane) of a single crystal of $\alpha$-$Al_2O_3$ or $NdAlO_3$ or the like, in the direction of [001], and employing the double temperature growth method, a thin film is formed on the substrate by a step flow growth process in which the starting point is a step of the substrate as shown in FIG. 4, and a high quality a-axis oriented Bi-2223 thin film having a good superconducting property can be obtained.

Example 1

Figure 5:
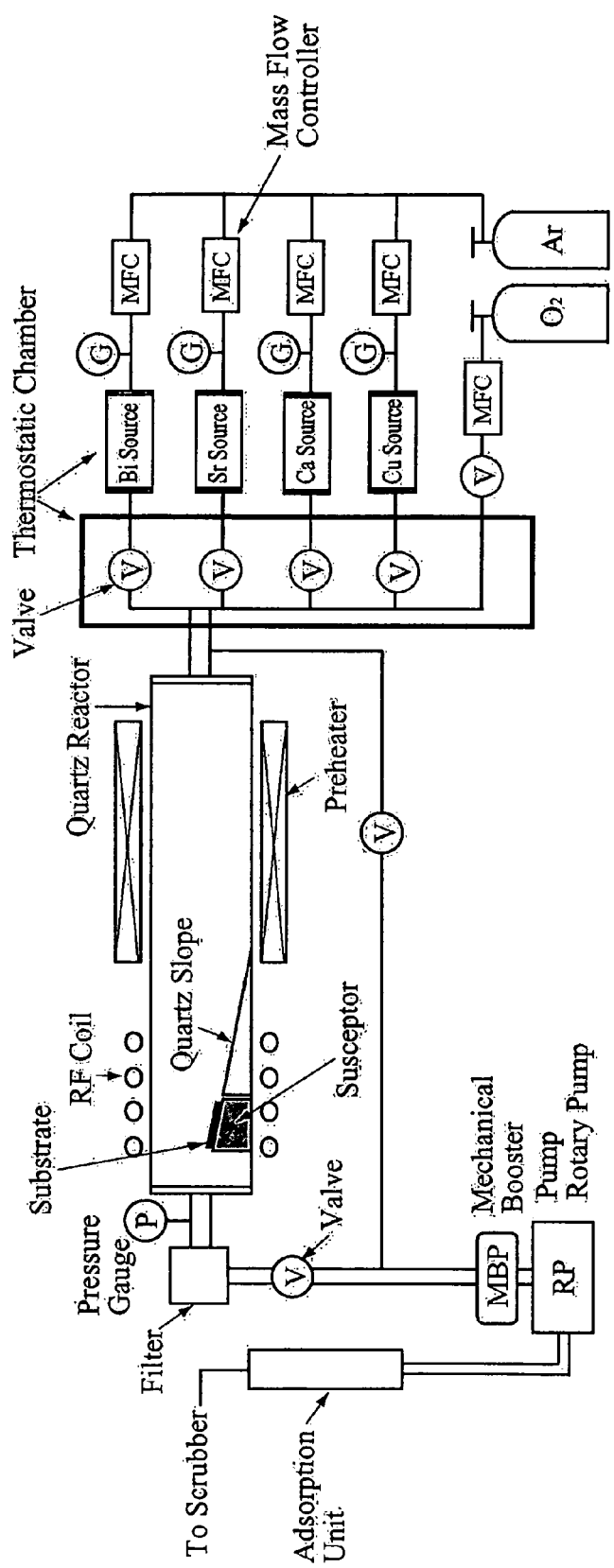
FIG. 5 is a conceptual drawing of an MOCVD thin film forming device.

Using a vicinal substrate cut with a finite angle θ from a (110) plane of a $LaSrAlO_4$ single crystal in the direction of [001], a Bi-2223 superconductor thin film was manufactured by metal-organic chemical vapor deposition (MOCVD). The conceptual drawing of the MOCVD device used in this case is shown in FIG. 5. The film was formed under the following conditions: $Bi(C_6H_5)_3$, $Sr(DPM)_2$, $Ca(DPM)_2$, and $Cu(DPM)_2$ (DPM: dipivaloylmethan) were used as metal-organic materials while each temperature was maintained at 72° C., 176° C., 161° C., and 80° C., respectively; the Ar carrier gas flow rate was 100, 300, 300, 70 sccm, respectively; the total pressure was 50 torr; the oxygen partial pressure was 23 torr; and the substrate temperature was 553° C. Under these conditions, an a-axis (or b-axis) oriented Bi-2223 thin film was heteroepitaxially grown, and then continually homoepitaxially grown at a temperature as high as the substrate temperature of 680° C. without changing the gas atmosphere. For the film formation in this case, substrates having inclination angles θ of 5°, 10°, and 15° were used.

Figure 9A:
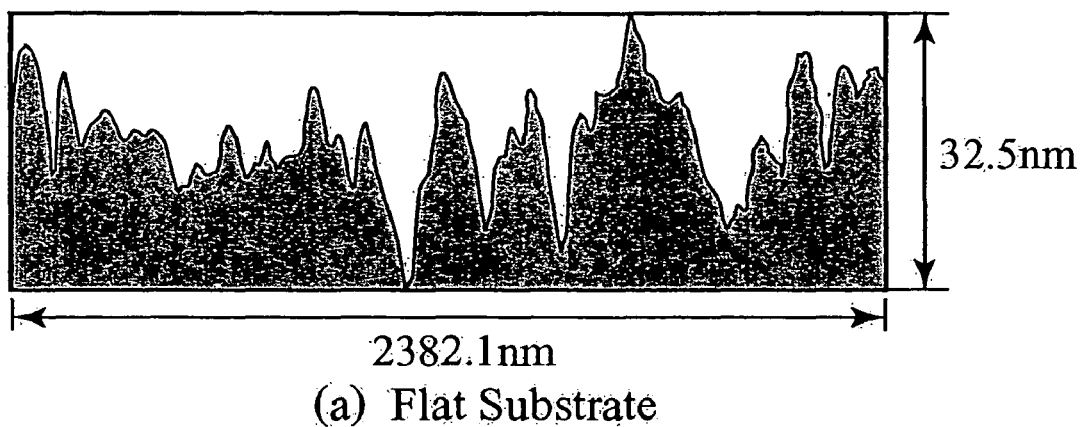
FIGS. 9A and 9B show atomic force microscope (AFM) images of Bi-2223 thin film surfaces.
Figure 9B:
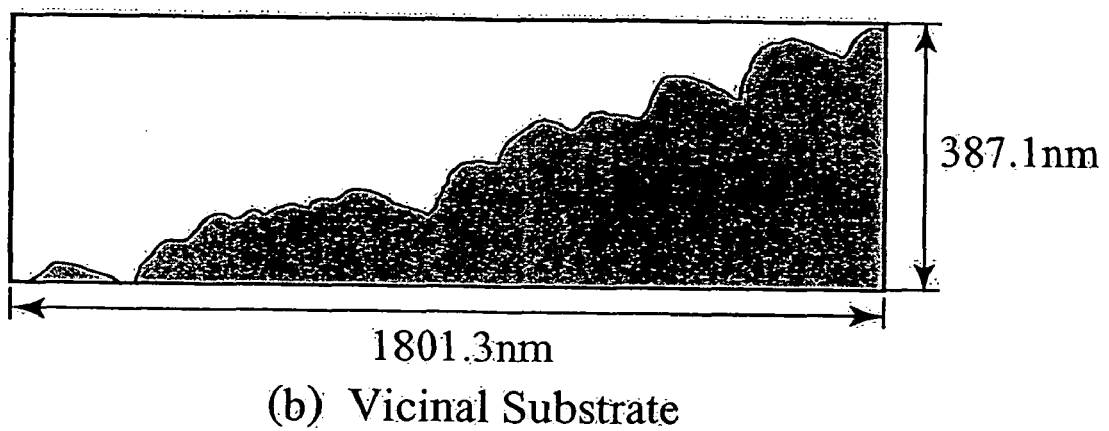

FIGS. 9A and 9B show atomic force microscope (AFM) images of surfaces of the a-axis oriented Bi-2223 thin films grown on a flat substrate and a vicinal substrate at the double temperatures.

Figure 10A:
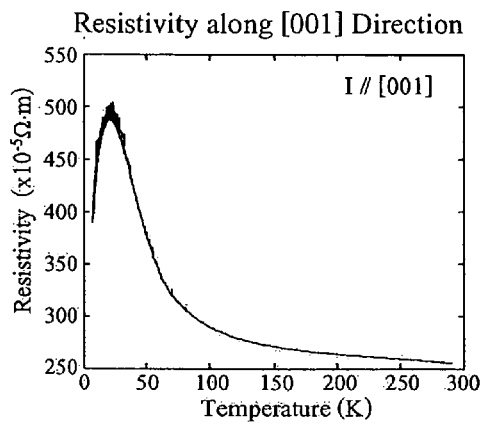
FIGS. 10A and 10B show cross-sections of the Bi-2223 thin films under the atomic force microscope (AFM) images.
Figure 10B:
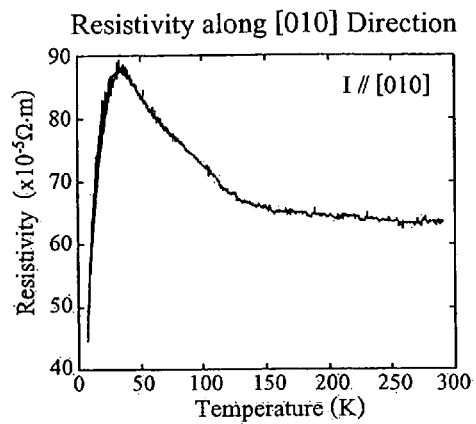
Figure 10C:
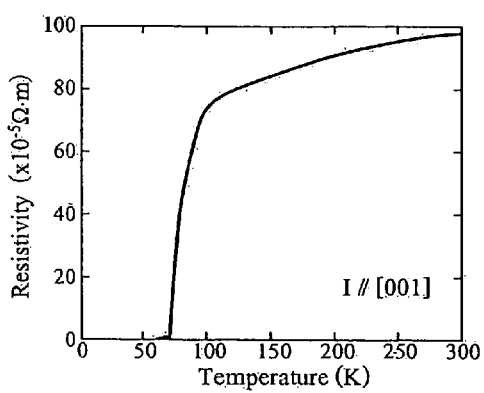
Figure 10D:
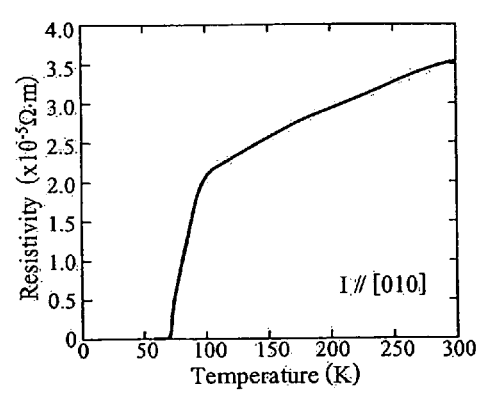

FIGS. 10A and 10B show cross-sections thereof. From these it can be confirmed that the a-axis oriented Bi-2223 thin film grown on a vicinal substrate at the double temperatures was formed by a step flow growth process, evenly, and continually.

Figure 11B:
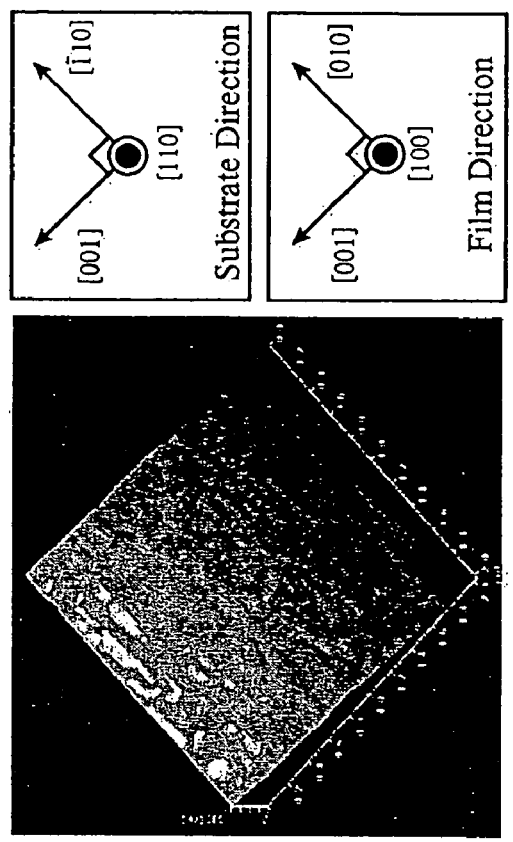
FIGS. 11A and 11B shows temperature dependences of resistivity of the Bi-2223 thin films.
Figure 11A:
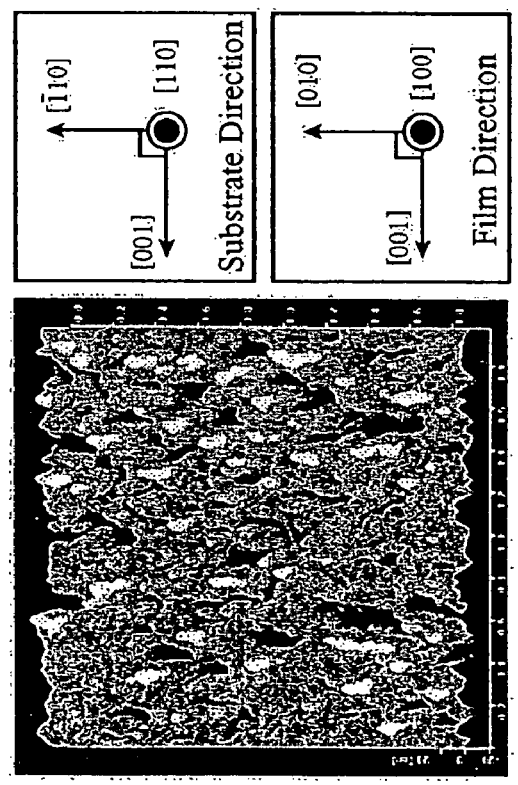

FIGS. 11A and 11B respectively shows temperature dependences of resistivity of the a-axis oriented Bi-2223 thin films grown on a flat substrate and a vicinal substrate at the double temperatures. Measurement was performed by the standard four terminal method. Among the films formed in this case, a film having an inclination angle θ of 15° showed the best superconducting properties.

As described above, when an a-axis oriented Bi-2223 oxide superconductor thin film is formed, growth on a vicinal substrate by the double temperature growth method forms a thin film by a step flow growth process. Therefore a high quality a-axis oriented Bi-2223 thin film having excellent superconducting properties and an even and flat surface, without crystal flow, can be produced.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description but is only limited by the scope of the appended claims.

What is claimed is:

1. A method of manufacturing a Bi-based oxide superconductor thin film having a c-axis parallel to a (110) or (10-10) crystal plane of a substrate and one of a-axis and b-axis being oriented perpendicular to the (110) or (10-10) crystal plane of the substrate, the method comprising the steps of:
   depositing the oxide superconductor film on a vicinal substrate selected from the group consisting of LaSrAlO$_4$, LaSrGaO$_4$, α-Al$_2$O$_3$ and NdAlO$_3$, while supplying oxygen, wherein the depositing includes
   heteroepitaxially growing the one of a-axis and b-axis oriented oxide superconductor thin film at a first temperature, and then homoepitaxially growing the oxide superconductor thin film on the heteroepitaxially grown film at a second temperature which is higher than the first temperature,
   wherein a lattice constant of the crystal plane of the superconductor thin film is an approximate integer multiple of a lattice constant of the crystal plane of the substrate and the oxide superconductor thin film is Bi$_2$Sr$_2$Ca$_2$Cu$_3$O$_{10+X}$ (where X is a positive number less than unity) or Bi$_2$Sr$_2$CuO$_{6+Y}$ (where Y is a positive number less than unity) thin film.

2. A method of manufacturing an oxide superconductor thin film according to claim 1, wherein
   the Bi-based oxide superconductor film is deposited on a vicinal substrate surface cut with a finite angle θ from a (110) plane of a single crystal of LaSrAlO$_4$, LaSrGaO$_4$ in the direction of [001], or a vicinal substrate surface cut with a finite angle θ from a (10-10) plane of a single crystal of α-Al$_2$O$_3$ and NdAlO$_3$ in the direction of [0001].

3. A method of manufacturing an oxide superconductor thin film according to claim 1, wherein said first temperature is between 500° C. and 600° C.

4. A method of manufacturing an oxide superconductor thin film according to claim 1, wherein said second temperature is between 650° C. and 750° C.

5. An oxide superconductor thin film deposited on a vicinal substrate having a c-axis parallel to a (110) or (10-10) crystal plane of a substrate and one of an a-axis and a b-axis being oriented perpendicular to the (110) or (10-10) crystal plane of the substrate,
   wherein a lattice constant of a single crystal of the thin film is an approximate integer multiple of a lattice constant of a single crystal of the substrate, the vicinal substrate is selected from the group consisting of substrates of LaSrAlO$_4$, LaSrGaO$_4$, α-Al$_2$O$_3$, and NdAlO$_3$, the superconductor thin film is Bi$_2$Sr$_2$Ca$_2$Cu$_3$O$_{10+x}$ (where X is a positive number less than unity) or Bi$_2$Sr$_2$CuO$_{6+Y}$ (where Y is a positive number less than unity) thin film and which is manufactured such that the said thin film is heteroepitaxially grown at a first temperature, then homoepitaxially grown thereon at a second temperature which is higher than the said first temperature.

6. An oxide superconductor thin film according to claim 5, wherein
   the Bi-based oxide superconductor film is formed on a vicinal substrate surface cut with a finite angle θ from a (110) plane of a single crystal of LaSrAlO$_4$, LaSrGaO$_4$ in the direction of [001], or a vicinal substrate surface cut with a finite angle θ from a (10-10) plane of a single crystal of α-Al$_2$O$_3$ and NdAlO$_3$ in the direction of [0001].

7. An oxide superconductor thin film according to claim 5, wherein the oxide superconductor thin film is a Bi-2223 thin film, and one unit cell of the Bi-2223 is in conformity with three units of any one of the single crystal substrate of LaSrAlO$_4$ having a (110) plane, LaSrGaO$_4$ having a (110) plane, α-Al$_2$O$_3$ having a (10-10) plane, or NdAlO$_3$ having a (10-10) plane.

8. An oxide superconductor thin film according to claim 5, wherein the oxide superconductor thin film is a Bi-2201 thin film, and one unit cell of the Bi-2201 is in conformity with three units of any one of the single crystal substrates of LaSrAlO$_4$ having a (110) plane, LaSrGaO$_4$ having a (110) plane, α-Al$_2$O$_3$ having a (10-10) plane, or NdAlO$_3$ having a (10-10) plane.

* * * * *